United States Patent [19]

Imai et al.

[11] Patent Number: 4,899,251
[45] Date of Patent: Feb. 6, 1990

[54] POWER SUPPLY NETWORK OF PRINTED CIRCUIT BOARD

[75] Inventors: Tsutomu Imai; Norio Sengoku, both of Hadano, Japan

[73] Assignee: Hitachi, Ltd., Tokyo, Japan

[21] Appl. No.: 264,039

[22] Filed: Oct. 28, 1988

[30] Foreign Application Priority Data

Oct. 29, 1987 [JP] Japan ................................. 62-274432

[51] Int. Cl.$^4$ ............................................. H05K 1/00
[52] U.S. Cl. ..................................... 361/346; 361/397
[58] Field of Search ................ 361/397, 346, 404, 355

[56] References Cited

U.S. PATENT DOCUMENTS 4,685,033  8/1987  Inoue ................................... 361/397

FOREIGN PATENT DOCUMENTS 61-139099  6/1986  Japan .

Primary Examiner—Roy N. Envall, Jr.
Attorney, Agent, or Firm—Fay, Sharpe, Beall, Fagan, Minnich & McKee

[57] ABSTRACT

In a power supply network of a printed circuit board, a through hole network for power supply electrically connected to main power supply pads connected with power supply cables is electrically and substantially independent of an internal network comprising networks of power supply layers on the like and a through hold network for load. Thereby, each of source currents supplied from the power supply cables reaches the through hole network for each load, once, via the through hold network for power supply and horizontal buses, therefore the dispersion in the drop of voltage across the main power supply pads and each of the loads is effectively decreased.

20 Claims, 3 Drawing Sheets

POWER SUPPLY NETWORK OF PRINTED CIRCUIT BOARD

BACKGROUND OF THE INVENTION

1. Field of the Invention

The present invention relates to the power supply network of a printed circuit board for supplying power to logic cards or the like attached to a large scale computer or the like.

2. Description of the Prior Art

The network technique for supplying power to logic cards or the like constituting logic parts of a large scale computer is, for example, described in Japanese Publication of Unexamined Patent Application No. 61-139,099.

This document shows a structural example in which a plurality of logic cards (to be designated the loads, hereinafter) are connected on a back board (to be designated the printed circuit board, hereinafter), and describes the network technique of the power supply in which horizontal buses are attached on one plane of the printed circuit board in order to minimize the voltage drop occuring in the inside of the board when the plurality of the loads are supplied with current.

Referring to FIG. 2, the conventional technique will be described.

In FIG. 2, the printed circuit board 5 has loads 1 composed of a plurality of logic cards carrying logic elements, the loads 1 being attached to sockets 3 by means of lead pins 2 mounted on the loads 1. Within the sockets 3, said lead pins 2 are electrically connected to contact points 4, and further the contact points 4 are connected to through hole network 6 formed in the inside of the board 5.

Said through hole network 6 is formed through the board 5, from a first principle plane of the board 5 where the loads 1 are attached to the other plane across the whole thickness, and is electrically connected to power supply pads 17 formed on the other plane respectively.

On the first principle plane of said board 5, main power supply pads 7 are formed in the vicinities of its peripheral edge, and secured by fixtures or bolts 10 to one end of a power cable 9 through which external power is supplied to the loads 1.

In the inside of said board 5, power supply layer 8 is formed in parallel with the first principle plane substantially throughout the entire periphery. This power supply layer 8 is connected directly with each through hole network 6 at each of the stations, thereby an internal network being formed.

Said power supply layer 8 is, in the vicinity of its peripheral edge, connected directly with the through hole network 6 electrically connected to said main power supply pad 7. In this structure, the source voltage supplied through the cables for power supply 9 and the main power supply pads 7 is applied to each of the loads 1 through the power supply layer 8 and the through hole network 6.

Now, in the prior art shown in FIG. 2, horizontal buses 11, formed by working conductive metal such as aluminum (Al) into a frame-like shape, are secured to each of the power supply pads 17 by means of bolts 10, on the other plane of the board 5, to minimize the voltage drop across the main power supply pads 7 or the like and each of the loads 1.

However, though said prior art is available as the means for decreasing the whole voltage drop in the inside of the board 5, there is no consideration for the dispersion in the voltage occurring among a plurality of the loads 1.

Thus, the drop of voltage is extremely higher in the load 1 attached near the center of the first principle plane of the board 1 than in the load 1 attached near the peripheral edge because of the difference in the power supply path from said main power supply pad 7. Consequently, it is difficult to maintain the stability of the device operation, therefore, it must be necessary to take measures in which the allowable margin of the source voltage is broadened.

SUMMARY OF THE INVENTION

In view of the foregoing, it is an object of the present invention to provide a power supply technique of a printed circuit board which can realize reliable device operation by keeping the voltage drop occurring in the inside of the board as uniform as possible. According to the present invention, there is provided a power supply network for supplying a plurality of loads attached on a first principle plane of a printed circuit board with source voltage, characterized by having an internal network comprising first networks formed on at least one plane of said board and a through hole network for load intersecting the first networks; horizontal buses attached on the other plane of said board and electrically being connected to said internal network; and main power supply pads so secured as to be connected to feeder lines in the vicinities of feeder parts on the first principle plane of said board and being connected to said horizontal buses by means of a through hole network for power supply, said through hole network for power supply connecting said horizontal buses to said main power supply pads, electrically and substantially being independent of said internal network.

In the power supply network having the above arrangement according to the present invention, the source current supplied from the feeder lines reaches the through hole network for each load, once, via the through hole network for power supply and the horizontal buses, therefore, the dispersion in the drop of voltage across the main power supply pads and each of the loads is descreased and stable device operation is secured.

The foregoing and other objects, advantages, manner of operation and novel features of the present invention will be understood from the following detailed description when read in connection with the accompanying drawings.

DETAILED DESCRIPTION OF THE PREFERRED EMBODIMENTS

Figure 1A:
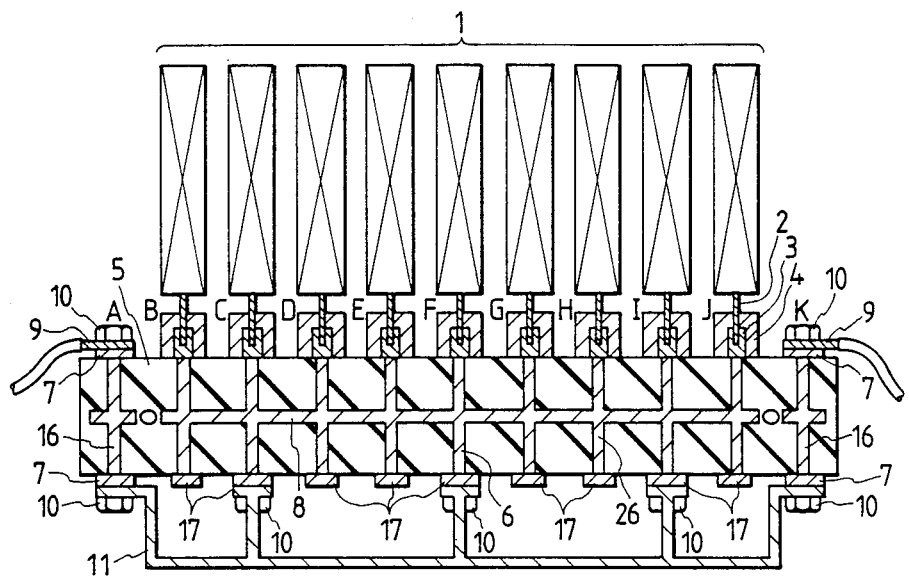
FIG. 1(a) is a sectional view of a power supply network of a printed circuit board which is an embodiment in accordance with the present invention.
Figure 1B:
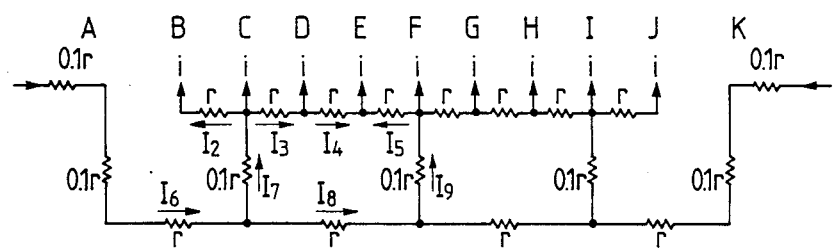
FIG. 1(b) is an equivalent circuit diagram of the power supply network of FIG. 1(a)
Figure 2A:
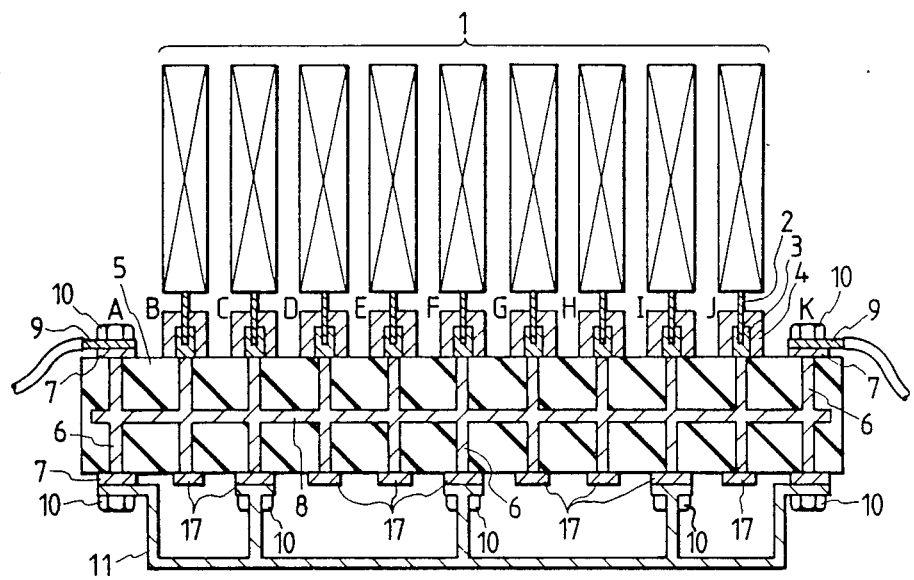
FIG. 2(a) is a sectional view of a power supply network of a printed circuit board in the prior art.
Figure 2B:
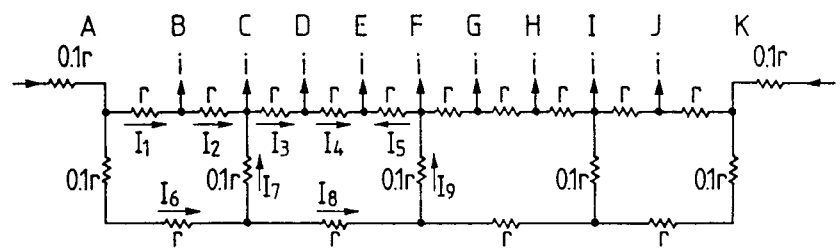
FIG. 2(b) is an equivalent circuit diagram of the power supply network of said FIG. 2(a)
Figure 3:
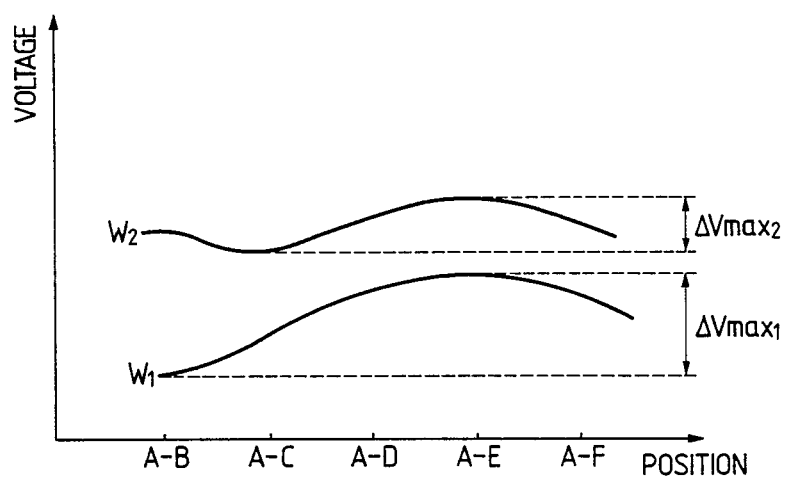
FIG. 3 is a voltage waveform chart showing drop of voltage across each of the positions A-F which are positioned in the board of the embodiment of the present invention and that of the prior art.

FIG. 1(a) is a sectional view of a power supply network of a printed circuit board which is an embodiment in accordance with the present invention, FIG. 1(b) is an equivalent circuit diagram of the power supply network of FIG. 1(a), FIG. 2(b) is an equivalent circuit diagram of the power supply network of FIG. 2(a) described in said prior art, FIG. 3 is a voltage waveform chart showing drop of voltage across each of the positions A–F which are positioned in the board of this embodiment and that of the prior art.

The board 5 shown in FIG. 1(a) has substantially the same structure as that shown in FIG. 2(a) described in said prior art. The board 5 having such structure may be, for example, formed in following manner. First, conductive material made of tungsten, copper foil or the like is deposited on the surface of sheet-like base material made of glass epoxy resin or polyimide resin by means of a printing technique to form power supply layer 8. Next, a plurality of same kind of the base materials formed in the manner as stated above are joined together by pressing or the like, and moreover, through which through holes are formed at the predetermined stations of the surface thereof by drilling or the like. Further, the inner faces of the through holes are plated with copper or the like to form through hole network 26 for load, through hole network 16 for power supply and the like, thereby the desired board 5 being obtained.

In said board 5, main power supply pads 7, power supply pads 17, and horizontal buses 11 are connected to each other in the same way as that described in said prior art. However, in this embodiment, the through hole network 16 for power supply directly connected to said main power supply pads 7 is so formed as to be electrically independent of the other through hole network 26 for load in the inside of the board 5, that is, to be electrically insulated in the inside of the board 5. Such structure of internal network may be realized by changing slightly the printing pattern of the power supply layer 8 in production of said board 5.

Since the power supply network is so formed in the manner as described above, the source current is supplied from a power source (not shown) through cables 9 delivered to the horizontal buses 11 mounted on the other plane of the board 5 through the through hole network for power supply 16 formed on the edge of the board 5 (in FIG. 1(a), the points A and K). Further, the source current is then supplied to each of the loads 1 via each of the through hole network 26 for each load.

Next, the function of this embodiment will be described with concrete examples, by comparing FIG. 1(b) which is the equivalent circuit in this embodiment with FIG. 2(b) which is the equivalent circuit in the prior art. Besides, in FIG. 1(b) and FIG. 2(b), the position of the main power supply pad 7 located on the left edge and the position of the main power supply pad 7 on the right edge, which are respectively connected with the cable 9, are respectively shown as A and K. And, the attachment stations of the loads 1 are designated by the numericals B–J from the left in both Figures.

In both Figures, it is assumed that each of currents flowing into the points B–J is i(A). And, it is assumed that the resistance of the power supply layer 8 between each of the adjacent two loads 1 among these loads 1 corresponding to B–J and the resistance of the power supply layer 8 from the main power supply pad 7 to the most nearest load 1 therefrom, are respectively r($\Omega$). Further, the resistance of the horizontal bus 11 between the main power supply pads 7 is assumed to be r($\Omega$), the contact resistance of the bolt 10 or the like fixing both of the horizontal bus 11 and the cable 9 being assumed to be 0.15($\Omega$).

In FIG. 2(b) of the prior art, the currents $I_1$–$I_9$ which flow into said parts are respectively expressed by the following equations.

$I_1 = 1.965\ i$ $I_2 = 0.965\ i$ $I_3 = 1.395\ i$ $I_4 = 0.395\ i$ $I_5 = 0.605\ i$ $I_6 = 2.535\ i$ $I_7 = 1.430\ i$ $I_8 = 1.105\ i$ $I_9 = 2.210\ i$

Then, the voltage drop across the main power supply pad 7 located on the edge (the point A) of the board 5 and each terminal of the loads 1 corresponding to the points B–F is respectively given by the following equations.

across A–B; $V_{AB} = 1.965\ ri$ across A–C; $V_{AC} = 2.93\ ri$ across A–D; $V_{AD} = 4.325\ ri$ across A–E; $V_{AE} = 4.72\ ri$ across A–F; $V_{AF} = 4.115\ ri$ And, the currents flowing from the point K into terminals of the loads 1 corresponding to the points J–K and the voltage drop across these points, respectively correspond to said first and second group of the equations, thereby getting the same values thereof, respectively.

In the manner as described above, the maximum dispersion $\Delta V_{max1}$ in the voltage drop across the point A and each terminal of the loads 1 corresponding to the points B–F is given by the following equation (in FIG. 3, the curve shown by $W_1$).

$4.72\ ri - 1.965\ ri = 2.755\ ri$

Now, for example if the packaging capability of electronic parts of the loads 1 increases, the currents which flow into the loads 1 will necessarily increase. However, as described above, the drop of voltage across the terminals of the loads 1 corresponding to these points varies to increase largely the dispersion in the voltage across the loads 1. Therefore, for example, the margin, in which the operation of an electronic unit of a large scale computer or the like can be maintained to be stable, becomes narrower, which results in unstable operation of the whole unit.

Next, the this embodiment will be described as follows about the above points.

In FIG. 1(b), the power supply layer 8 is electrically insulated between the main power supply pads 7 (the points A and K) connected with the cable 9 and the nearest loads 1 thereof corresponding to the points B and J. Besides, in the other portions, the power supply layer 8 has the same connecting network as that of FIG. 2(b).

In FIG. 1(b) of this embodiment, the currents $I_2$–$I_9$ which flow into said each of the parts are respectively expressed by the following equations.

$$I_2 = 1.000 \, i$$

$$I_3 = 1.340 \, i$$

$$I_4 = 0.349 \, i$$

$$I_5 = 0.651 \, i$$

$$I_6 = 4.500 \, i$$

$$I_7 = 3.349 \, i$$

$$I_8 = 1.151 \, i$$

$$I_9 = 3.349 \, i$$

And, the voltage drop across the main power supply pad 7 located on the edge (the point A) of the board 5 and each terminal of the loads 1 corresponding to the points B-F is, then, respectively given by the following equations.

$$\text{across A-B; } V_{AB} = 6.2849 \, ri$$

$$\text{across A-C; } V_{AC} = 5.2849 \, ri$$

$$\text{across A-D; } V_{AD} = 6.6339 \, ri$$

$$\text{across A-E; } V_{AE} = 6.9829 \, ri$$

$$\text{across A-F; } V_{AF} = 6.3319 \, ri$$

Besides, the currents flowing from the point K into each terminal of the loads 1 corresponding to the points J-F and the voltage drop across these points, respectively correspond to said first and second group of the equations of the embodiment, thereby, getting the same values thereof, respectively.

In the manner as described above, the maximum dispertion $\Delta V_{max2}$ in the voltage drop across the point A and each terminal of the loads 1 corresponding to the points B-F is given by the following equation (in FIG. 3, the curve shown by $W_2$).

$$6.9829 \, ri - 5.2849 \, ri = 1.698 \, ri$$

If the maximum dispersion $\Delta V_{max1}$ in the voltage drop across these loads 1 in the power supply network of board 5 of said prior art is 100%, the maximum dispersion $\Delta V_{max2}$ of this embodiment comes to some 60% of the former. From that point forward, in this embodiment, the dispersion in the voltage drop largely decreases.

Now, the voltage drop across the load 1 (e.g., B,J) in the vicinity of the main power supply pad 7 (the point A or K) connected with the cable 9 and the voltage drop across the load 1 (e.g., F) near the center of the board 5, have a relation to both of the resistance of the power supply layer 8 and the resistance of the horizontal bus 11.

Thus, the voltage drop across the load 1 corresponding to the point B, J or the like in the vicinity of the main power supply pad 7 located at point A or K depends on the resistance of the power supply layer 8 between the main power supply pad 7 corresponding to point A or B and said load 1. And, the voltage drop across the load 1 corresponding to the point E or the like near the center of the board 5, is dependent on the resistance of the horizontal bus 11.

Therefore, in the prior art, as seen from the curve shown by $W_1$ in FIG. 3, the resistance of the horizontal bus 11 is larger than that of the power supply layer 8 to increase the voltage drop across the load 1 corresponding to the point E or the like near the center, thereby the dispersion in the voltage across the loads 1 corresponding to the points B-J comes to be large.

From that point forward, in the power supply network of a printed circuit board which is an embodiment of the present invention, as shown in FIG. 1(a), the through hole network 16 for power supply connected with both the main power supply pads 7 located at the points A and K is separated from the power supply layer 8. Therefore, though the voltage drop across the main power supply pad 7 located at the point A or K and the load 1 corresponding to, e.g. the point B, J or the like near pad 7 comes to be large, as a result, it can be said that the difference between the voltage drop across load 1 corresponding to, e.g. the point E near the center of the board 5 and the voltage drop across the load 1 corresponding to, e.g. the point B, J or the like near point A or K comes to be small. Then, the voltage drop characteristic is so shown as the wave form $W_1$ in FIG. 3.

As seen from the difference between the waveform $W_1$ and $W_2$ in FIG. 3, in this embodiment, the voltage drop differences between the loads 1 near the edge of the board 5 and the loads 1 near the center largely decreases.

In the above embodiment, though a case has been described where the present invention is applied to the large scale computer which is in the field of the invention, the present invention is not limited thereto.

The effect which is obtained by the typical components disclosed in this application, will be described as follows.

That is, according to the present invention, there is provided a power supply network of a printed circuit board having an internal network comprising power supply layers formed in the inside of the board and a through hole network for load intersecting the power supply layers, horizontal buses attached on the other plane of the board and electrically being connected to said internal network, and main power supply pads so secured as to be connected to power supply cables in the vicinities of the peripheral edge on a first principle plane of said board and being connected to said horizontal buses by means of a through hole network for power supply, said through hole network for power supply connecting said horizontal buses to said main power supply pads electrically being independent of said internal network in the inside of the board. Thereby, each of the source currents supplied from the power supply cables reaches the through hole network for each load, once, via the through hole network for power supply and the horizontal buses, therefore the dispersion in the drop of voltage across the main power supply pads and each of the loads is effectively decreased and stable device operation is realized.

What is claimed is:

1. A power supply network for supplying power to a plurality of loads attached on one of two surface planes of a printed circuit board, comprising:
   an internal conductor network on a plane in said printed circuit board;
   a plurality of first through hole conductors intersecting said internal conductor network and being electrically connected to at least one of said loads;
   at least one horizontal bus attached on the other surface plane of said printed circuit board and being electrically connected within said printed circuit board to said first through hole conductors;
   a power supply conductor attached on one of the surface planes of said printed circuit board; and
   second through hole conductors electrically isolated within said printed circuit board from said internal conductor network and from said first through hole conductors, and said second through hole conductors being electrically connected to said bus and to said power supply conductor so as to minimize dispersions of feeding voltages to said loads fed from said power supply conductor.

2. A power supply network according to claim 1, wherein said printed circuit board contains a plurality of conductive layers, one of which layers being said internal conductor network and at least another of said layers intersecting said second through hole conductors.

3. A power supply network according to claim 1, wherein said power supply conductor is located adjacent the peripheral edge of said printed circuit board.

4. A power supply network, comprising:
   a printed circuit board having a body of electrically insulated material with a first planar surface and a second opposite parallel planar surface;
   a plurality of separate load contact means mounted on said first planar surface of said body in spaced apart relationship for respectively receiving separate electrically independent loads to be powered by said printed circuit board with substantially equal voltages;
   a planar electrically conductive load bus layer within said printed circuit board body and parallel to said surfaces;
   a plurality of first through hole electrical conductors respectively extending between each of said load contact means and said load bus layer;
   main power supply pad means on one of said surfaces of said printed circuit board for receiving input power supply voltage, and said main power supply pad means being spaced from and separate from said load contact means;
   a power supply bus extending generally parallel to and spaced from said load bus;
   a plurality of second through hole connectors electrically connected between said power supply bus and said load bus layer;
   at least one through hole conductor being spaced from and electrically isolated from said first through hole conductors within said body, and said second through hole conductor electrically connecting said main power supply pad means and said power supply bus.

5. The power supply network according to claim 4, wherein said power supply bus is mounted on one of said surfaces of said printed circuit board opposite from the surface mounting said main power supply pad means.

6. The power supply network according to claim 5, wherein said main power supply pad means is mounted on the same surface as said load contact means.

7. A power supply network according to claim 5, a power supply bus layer coplanar with and spaced from said load bus layer within said body and intersecting said second through hole conductors.

8. A power supply network according to claim 5, wherein said main power supply pad means is located closely adjacent the peripheral edge of said printed circuit board.

9. The power supply network according to claim 4, wherein said load contact means include socket means for respectively mounting a plurality of parallel logic cards.

10. A power supply network according to claim 5, wherein there are a plurality of said through hole conductors between said power supply bus and said main power supply pad means extending parallel to said first through hole conductors and parallel to said second through hole conductors.

11. A power supply network according to claim 4, wherein there are a plurality of said main power supply pad means and a plurality of said at least one through hole conductors commonly connected to said power supply bus.

12. The power supply network according to claim 5, including a plurality of coplanar power supply pads mounted on the surface of said printed circuit board opposite from said load contact means; said main power supply pad means and said load contact means being mounted on the same surface of said printed circuit board and being generally coplanar;
   said power supply bus being directly connected to a plurality of said power supply pads.

13. The power supply network according to claim 12, wherein said power supply pads correspond in number to and are directly opposite respective load contact means; said first through hole conductors extending paralell to each other and directly between corresponding pairs of aligned load contact means and power supply pads.

14. The power supply network according to claim 13, wherein each of said first through hole conductors intersects said load bus layer.

15. The power supply network according to claim 14, wherein said load contact means include socket means for respectively mounting a plurality of parallel logic cards.

16. The power supply network according to claim 15, wherein said main power supply pad means is located closely adjacent the peripheral edge of said printed circuit board.

17. The power supply network according to claim 4, wherein there are a plurality of pairs of main power supply pads, spaced from said load contact means and said power supply pads; the main power supply pads of each pair being respectively mounted on opposite surfaces of said printed circuit board and in transverse alignment; and said second through hole conductors extending parallel to said first through hole conductors and respectively directly between the main power supply pads of each pair.

18. The power supply network according to claim 5, wherein said load contact means include socket means for respectively mounting a plurality of parallel logic cards.

19. A power supply network according to claim 18, wherein said main power supply pad means is located closely adjacent the peripheral edge of said printed circuit board.

20. A power supply network according to claim 19, wherein there are a plurality of said through hole conductors between said power supply bus and said main power supply pad means extending parallel to said first through hole conductors and parallel to said second through hole conductors.

* * * * *